United States Patent [19]

Ciniglio et al.

[11] Patent Number: 5,370,297
[45] Date of Patent: Dec. 6, 1994

[54] SOLDERING APPARATUS

[75] Inventors: Alexander J. Ciniglio, Great Dunmow; Michael Tombs, Leigh-on-Sea; Neil Squire, Chelmsford, all of Great Britain

[73] Assignee: Pillarhouse International Limited, Essex, Great Britain

[21] Appl. No.: 25,585

[22] Filed: Mar. 3, 1993

[30] Foreign Application Priority Data

Mar. 3, 1992 [GB] United Kingdom ............. 9204525.1

[51] Int. Cl.$^5$ ............................................. B23K 1/08
[52] U.S. Cl. ................................. 228/40; 228/259; 118/416; 118/425; 118/426
[58] Field of Search .............. 228/40, 259, 254, 49.5; 118/425, 426, 416

[56] References Cited

U.S. PATENT DOCUMENTS

| | | | |
|---|---|---|---|
| 3,056,371 | 10/1962 | Frank | 228/259 |
| 4,869,418 | 9/1989 | Simpson et al. | 228/37 |

FOREIGN PATENT DOCUMENTS

| | | | |
|---|---|---|---|
| 234850 | 9/1987 | European Pat. Off. | |
| 481710 | 4/1992 | European Pat. Off. | |
| 51-9045 | 1/1976 | Japan | 228/40 |
| 62-76541 | 4/1987 | Japan | 228/40 |

OTHER PUBLICATIONS

58–86753; *Patent Abstracts of Japan*, vol. 7, No. 182, (E–192)(1327) 11 Aug. 1983; May 1983 (Complete Doc. Published).

*Primary Examiner*—P. Austin Bradley
*Assistant Examiner*—Jeffrey T. Knapp
*Attorney, Agent, or Firm*—Levisohn, Lerner & Berger

[57] ABSTRACT

In a soldering apparatus using a rotary station, a component holder is lowered and/or moved vertically by a stepper motor drive. A motor, lowers a drive shaft by a lead screw, and a second motor rotates the shaft via a toothed bearing wheel, the shaft having a hexagonal cross-section. A pivotable lobe couples the shaft to a shaft to lower the component holder and to rotate it (by rotation of shaft). The stepper motors allow for variable speed of vertical movement of the component holder and for selective rotation.

8 Claims, 1 Drawing Sheet

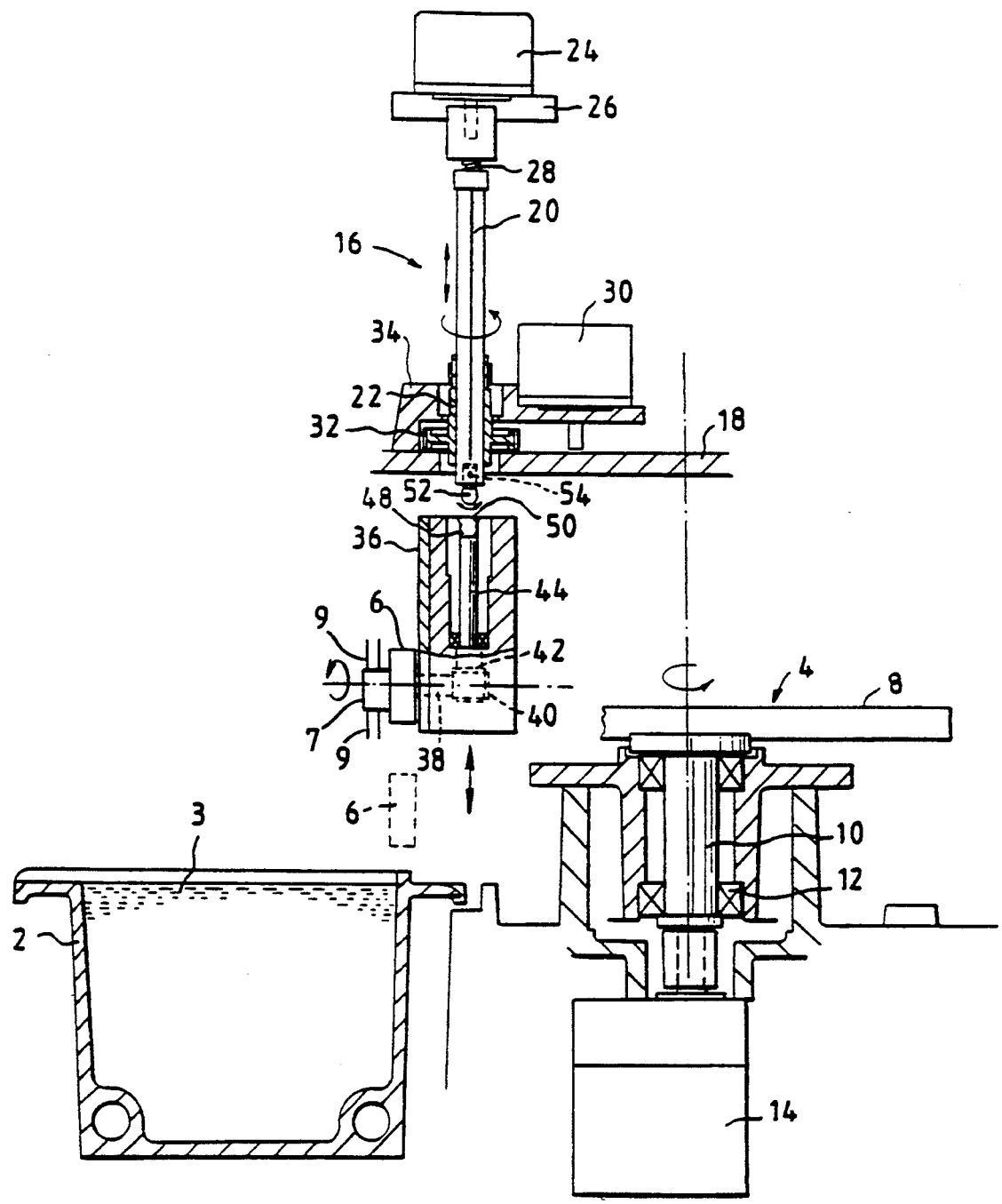

SOLDERING APPARATUS

The present invention relates to dip soldering apparatus. Such apparatus is described, for example, in EP-A-0234850.

BACKGROUND

The prior art systems raise, lower and rotate a component to be tinned by means of pneumatic drives. A drawback of this is that there is little or no control over the degree and rate of movement of the component.

SUMMARY OF THE INVENTION

A first aspect of the present invention provides a soldering apparatus comprising a rotary station for moving a component into a position above a solder bath, the station having a component holder for holding the component, means for raising and lower the component holder relative to a solder bath, and means for rotating the component holder on an axis, wherein the means for raising and lowering the component holder and/or the means for rotating the component holder comprises an electric motor.

By providing one or more variable speed motors such as a servo motor or stepper motor to control the movement of the component holder in the vicinity of the solder bath, it is possible to control and vary the rate of movement of the component, and also to rotate the component by a predetermined, variable amount.

By having a slow speed of movement of the component as it nears and then enters the solder in the bath, thermal shock on the component can be reduced. The speed of removing a component from the solder is often fixed by the customer to meet required standards for tinning component leads. In systems using a pneumatic drive, downward speed is dictatated by the maximum speed of entering the bath, and the designated speed of leaving the bath will be applied throughout the upward movement of the component. Thus the apparatus proposed by the present invention can advantageously decrease the cycle time by having a greater speed of movement of the component holder on its approach to the bath, and by accelerating movement after the component leads have been removed from the solder. Pneumatically driven systems require the component holder to be latched in one of a number of rotational positions to provide a fixed orientation for the component. This imposes a limitation on the angles through which a component can be rotated, and so makes it difficult to adapt the system to handle components of odd shape. By using a positioning motor such as a stepper motor or servo motor to control the rotation of the component holder, the holder can be stepped through a predetermined angle and held in place by control of the motor.

Other aspects, preferred features and advantages of the invention will be apparent from the following description and the accompanying claims.

BRIEF DESCRIPTION OF THE DRAWING

The single FIGURE of drawings shows, in section, details of a dip soldering apparatus forming an embodiment of the invention.

DESCRIPTION OF THE PREFERRED EMBODIMENTS

The drawing shows a soldering apparatus comprising a solder bath 2 for containing molten solder 3, and a rotary station 4 carrying a plurality of component holders 6 (only one is shown) supported on a rotatable table 8. The component holder 6 is shown carrying a component 7 having leads 9 which are to be tinned by dipping them in the solder 3. The table 8 is carried on a shaft 10 journalled in bearings 12 and rotated by a motor 14 to move the component holders 6 stepwise through stations arranged around the table 8, as is well known in the art. Such stations may include stations for loading and unloading a component, a fluxing station for applying flux to tags or leads to be soldered or tinned and a testing station as well as a soldering/tinning station.

Arranged in a fixed position above each station is a drive unit 16 for raising and lowing a component holder 6 and rotating the component holder 6. The drive units 16 are mounted on a fixed table 18.

The drive unit 16 comprises a hexagonal cross-section drive shaft 20 which is slidably journalled in a hexagonal section bush 22. In another preferred embodiment a generally square cross-section shaft having arcuate side faces (sold under the trade mark 'polygon') may be used, as such shafts with the appropriate bush can provide reduced backlash in the rotational direction.

A first stepper motor 24 is mounted on a platform 26 and drives a leadscrew 28 which is threadedly coupled to a vertical bore in the shaft 20. As screw 28 is rotated by the motor 24, the shaft 20 is moved vertically in the bush 22.

A second stepper motor 30 is mounted on the platform 18 and is coupled by a toothed belt to a gear ring 32 formed on the bush 22, for rotating the bush 22 in a housing 34. As the bush 22 is rotated, the drive shaft 20 will also be rotated.

The component holder 6 is mounted on a casing 36 which is mounted to slide vertically on the table 8. The casing 36 is urged to an uppermost position by a spring (not shown) as is generally well known in the art. The component holder 6 is mounted on a shaft 38 journalled in the casing 36 and carrying a 45 degree helical gear 40 at its other end. Gear 40 meshes with a second helical gear 42 which is carried on the lower end of a shaft 44. The shaft 44 is rotable in the casing 36 so that as the shaft 44 rotates it rotates the component holder 6.

The shaft 44 has a notch 48 at its upper end. Notch 48 has a square cross-section at its base and is flared at its mouth 50.

Drive shaft 20 carries a lobe 52 at its lower end. Lobe 52 is pivotably mounted on a pin 54 on the shaft 20, to pivot across the mouth of the notch 48 (as shown by the arrow). The lobe 52 has a cylindrical lower surface which is a snug fit in the square section base of the notch 48. As the drive shaft 20 is lowered, the lobe 52 engages in the base of the notch 48 to form a close coupling (i.e. very little play) between the shaft 20 and shaft 44). The pivotal mounting of the lobe 52 provides a particularly simple mechanism for allowing for tolerance in the relative positions of the drive unit 16 and shaft 44 in the radial direction of the table 8.

In use, the rotary table 8 is rotated to bring a component holder 6 into position at the soldering station, above the solder bath 2. Motor 24 is actuated to rotate leadscrew 28 and drive shaft 20 downwards. Lobe 52 engages in the notch 48 and continued downward movement of shaft 20 moves the casing 36 and component holder 6 down towards the solder bath 2 against the force of the spring tending to urge the casing 36 upwards. By using a variable speed motor 24 such as a stepper motor, the speed of driving the shaft 20 downwards, and hence the speed of vertical movement of the component holder 6 can be varied, for example to slow the speed as the component nears the bath, and so reduce thermal shock as the component leads enter the solder 3 in the bath 2.

Motor 24 is then reversed, again varying the speed if desired, to allow the casing 36 and component holder 6 to move upwards under the action of the spring. The speed of upward movement is controlled by the upward movement of the shaft 20 under the action of the motor 24 which rotates the leadscrew 28 in the reverse direction. The initial speed of upward movement is controlled to remove the component leads 9 from the solder 3 at a desired speed and the movement may then be accelerated to move the component holder 6 and casing 36 quickly to the fully raised position.

If leads on more than one side of the component are to to be soldered, the casing 36 is raised to bring the component just clear of the bath 2, and motor 30 then actuated. Motor 30 rotates shaft 20 which in turn rotates the shaft 44 in the casing 36 to rotate the component holder 6 about the axis A—A via the gear coupling 40,42. Stepper motor 30, via the shaft 20 and gear coupling 40,42 holds the component holder 6 in the required orientation during vertical movement, and so it is not necessary to use a latching mechanism to keep the holder 6 in position during vertical movement and soldering.

When the shaft 20 is disengaged from shaft 44, the component holder 6 would become free to rotate during rotation of the table 8 to move the casing 36 to the next station. To prevent this, the shaft 44 is returned to predetermined rotational position after soldering, where it is arranged to engage a key (not shown) as the casing 36 returns to its uppermost position.

It will be appreciated that motors 28, 30 may be operated simultaneously, to rotate the component holder 6 during vertical movement, thus helping to further reduce the cycle time. This is particularly useful in allowing a component to be inverted while moving it away from the solder bath 2, to prevent tears forming on the ends of the soldered tags or leads.

The motors 28,30 are under microprocessor control to allow ready programming of movement of the shaft 20 at each station, and a datum position for the shaft 20 is provided to avoid accumulated errors during operations.

The solder bath 2 may include an applicator in the form of a pot which is raised through the surface of the solder in the bath to present a clean solder surface to the tags of the component, or a nozzle through which solder is pumped to provide a flowing stream into which the component leads are dipped.

Various modifications may be made to the described embodiment and it is desired to include all such modifications as fall within the accompanying claims.

What is claimed is:

1. Soldering apparatus comprising a solder bath and a rotary station for moving a component into a position above the solder bath, the rotary station having a component holder for driving said component, a drive shaft which is coupled to the component holder, driving means for driving the drive shaft in its lengthwise direction to translate the component holder towards and away from the solder bath, and rotating means for drivably rotating the component holder about an axis transverse to the lengthwise direction while it is being translated towards and away from the solder bath wherein the driving means is operable independently of the rotating means.

2. A soldering apparatus as claimed in claim 1, wherein a drive shaft is provided, and means is provided for coupling the drive shaft to the component holder, the drive shaft being moved linearly to raise and lower the component holder, and rotated to cause rotation of the component holder.

3. A soldering apparatus as claimed in claim 1, wherein the electric motor is a variable speed electric motor.

4. A soldering apparatus as claimed in claim 3, wherein the electric motor is a stepper motor.

5. Soldering apparatus comprising a solder bath and a rotary station for moving a component into position above the solder bath, the rotary station having a component holder for holding said component, an elongate drive shaft which is rotably coupled to the component holder by coupling means, whereby rotation of the drive shaft about its lengthwise direction causes rotation of the component holder about an axis transverse to the lengthwise direction, means for moving the drive shaft in the lengthwise direction to translate the component holder in the lengthwise direction towards and away from the solder bath, and means for rotating the drive shaft about the lengthwise direction to rotate the component holder about its axis.

6. A soldering apparatus as claimed in claim 5, wherein the component holder axis is substantially perpendicular to the lengthwise direction.

7. Apparatus as claimed in claim 5, wherein the drive shaft is coupled to the component holder by means of pivotally mounted lobe which is received in a recess in a second shaft which is coupled to the component holder.

8. A soldering apparatus as claimed in claim 5, wherein the shaft is rotatable as it is being moved linearly.

* * * * *